United States Patent [19]

Woodward

[11] Patent Number: 4,486,770
[45] Date of Patent: Dec. 4, 1984

[54] ISOLATED INTEGRATED CIRCUIT TRANSISTOR WITH TRANSIENT PROTECTION

[75] Inventor: Gary K. Woodward, Kokomo, Ind.

[73] Assignee: General Motors Corporation, Detroit, Mich.

[21] Appl. No.: 257,509

[22] Filed: Apr. 27, 1981

[51] Int. Cl.³ .................... H01L 27/02; H01L 29/72; H01L 27/12; H01L 27/04
[52] U.S. Cl. ........................ 357/46; 357/34; 357/47; 357/48; 357/49; 357/51
[58] Field of Search ................ 357/46, 34, 47, 48, 357/49, 51

[56] References Cited

U.S. PATENT DOCUMENTS

| | | | |
|---|---|---|---|
| 3,379,941 | 4/1968 | Blanluet | 357/51 |
| 3,624,454 | 11/1971 | Adkinson et al. | 357/51 |
| 3,676,714 | 7/1972 | Wensink et al. | 357/51 |
| 3,755,722 | 8/1973 | Harland, Jr. et al. | 357/51 |
| 3,821,780 | 6/1974 | Harland, Jr. et al. | 357/51 |
| 3,940,785 | 2/1976 | Genesi | 357/48 |
| 3,971,060 | 7/1976 | Leuschner | 357/48 |
| 4,011,580 | 3/1977 | Kasperkovitz | 357/51 |
| 4,133,000 | 1/1979 | Greenstein | 357/51 |
| 4,360,822 | 11/1982 | Roger | 357/46 |
| 4,426,658 | 6/1984 | Gontowski, Jr. | 357/48 |

FOREIGN PATENT DOCUMENTS

| | | | |
|---|---|---|---|
| 54-105977 | 8/1979 | Japan | 357/46 |
| 54-154280 | 12/1979 | Japan | 357/46 |
| 55-59768 | 5/1980 | Japan | 357/46 |
| 55-108765 | 8/1980 | Japan | 357/46 |
| 55-123161 | 9/1980 | Japan | 357/46 |
| 2018511 | 10/1979 | United Kingdom | 357/46 |

Primary Examiner—Andrew J. James
Assistant Examiner—J. Carroll
Attorney, Agent, or Firm—Robert J. Wallace

[57] ABSTRACT

An integrated circuit having a bipolar transistor with an integral base region resistor. The resistor coacts with an isolation wall extension in the integrated circuit to provide compact integral protection against transient polarity reversal between contacts to the resistor and the transistor collector.

4 Claims, 5 Drawing Figures

ISOLATED INTEGRATED CIRCUIT TRANSISTOR WITH TRANSIENT PROTECTION

FIELD OF THE INVENTION

This invention relates to an integrated circuit having integral protection from electrical transients. More specifically, it relates to a compact transient protection geometry for a transistor and integral base region resistor in an isolation pocket of an integrated circuit.

BACKGROUND OF THE INVENTION

Some electrical circuits require an electrical resistance between the base region and emitter region of a bipolar transistor. In a vertical bipolar transistor, it is convenient to provide this resistance by simply elongating the transistor base region and placing an emitter region at one end of the base region adjacent to a first base region contact. A second base region contact is provided at the other end of the elongated base region, and an electrical shunt provided between the emitter region and the second base contact. In a vertical bipolar transistor, the isolation pocket in which the transistor is disposed forms the collector region of the transistor. Hence, an additional, i.e. collector, contact must be provided to the semi-conductor material forming the isolation pocket. In operation, the transistor emitter region is at an opposite potential from that of the collector. However, I have found that undesired electrical transients can occur in which this polarity is reversed. If the base resistor and collector contacts are adjacent to one another, there may be little resistance between them upon such polarity reversal, since their interjacent PN junction would be forwardly biased. In such event, this could provide almost a substantially direct short between these two contacts to electrical ground. If the transient has sufficient energy, this could produce permanent damage to the device.

I have found a new layout geometry for such resistor-transistor combinations in an isolated integrated circuit. It provides integral protection against such electrical transients in a compact manner.

OBJECTS AND SUMMARY OF THE INVENTION

An object of this invention is to provide an improved geometry for bipolar transistors with integral base region resistors in an isolation pocket of an integrated circuit.

Another object of the invention is to provide a compact integrated protection from predetermined electrical transients that reverse polarity between adjacent regions in an isolation pocket that would ordinarily be separated by a reversed bias PN junction.

A still further object of the invention is to provide an improved design for a bipolar vertical transistor having an elongated base region integral resistor and an emitter-resistor electrical shunt.

The objects of this invention are achieved by a transistor configuration in which a base region of a bipolar transistor provides an integral resistor especially for connection to the emitter region of that transistor. My improved transistor configuration coacts with an isolation wall surrounding the transis- tor-resistor combination. A portion of the isolation wall projects into the isolation pocket. Contacts to the collector region of the transistor and to the resistor are disposed on opposite sides of the isolation wall. In this manner the two contacts can be closely spaced yet do not provide a low resistance path directly therebetween.

BRIEF DESCRIPTION OF THE DRAWING

Other objects, features and advantages of this invention will become more apparent from the following description of preferred examples thereof and from the drawing in which.

DESCRIPTION OF THE PREFERRED EMBODIMENTS

Figure 1:
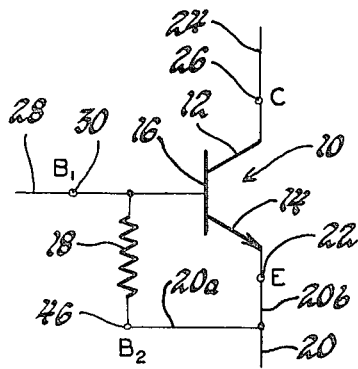
FIG. 1 shows an electrical schematic of a bipolar transistor and resistor shown in the layout shown in FIGS. 2–4 and the layout shown in FIG. 5.

Reference is now made to FIG. 1 which shows an electrical schematic of a bipolar transistor 10 having a collector region 12, an emitter region 14 and a base region 16. Base region 16 is connected to a resistor 18 which, in turn, is connected to the transistor emitter region 14 via conductors 20a and 20b. Conductors 20a and 20b are electrically parallel extensions of emitter conductor 20. Conductor 20b makes contact with the emitter region 14 at 22. Analogously conductor 24 makes contact with transistor collector region 12 at 26. A base region conductor 28 makes contact with the base region 16 of transistor 10 at 30. The connections 22, 26 and 30 are respectively designated E, C, and $B_1$.

Figure 2:
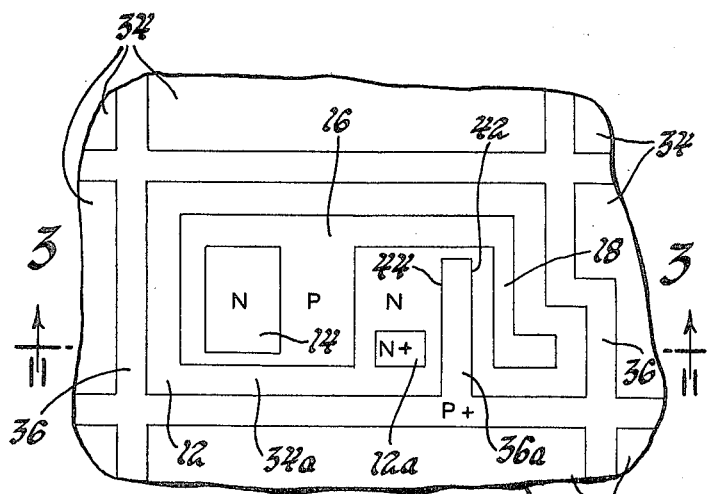
FIG. 2 shows a plan view of diffusion regions producing a vertical bipolar NPN transistor with integral base region resistor in an isolation pocket of an integrated circuit.
Figure 3:
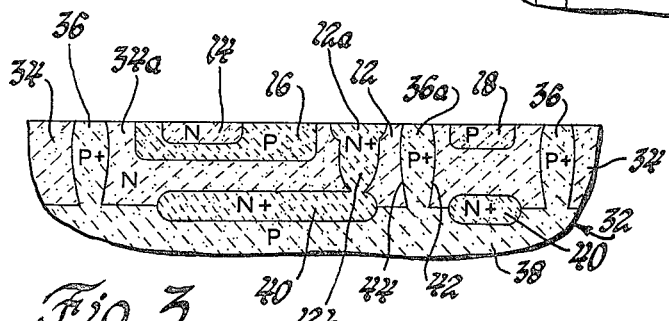
FIG. 3 shows a sectional view along the line 3—3 of FIG. 2.
Figure 4:
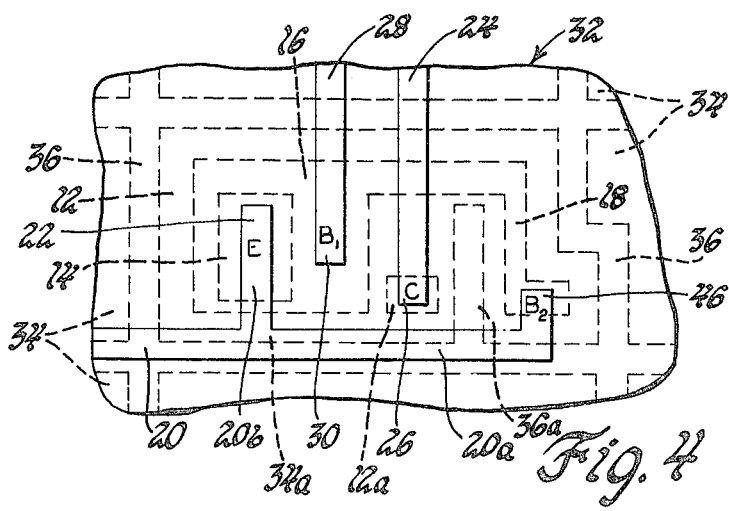
FIG. 4 shows a plan view of the FIG. 2 device after a metallization layer has been applied.

The transistor-resistor configuration described above with respect to FIG. 1 can be formed in a junction isolated integrated circuit in the manner illustrated in FIGS. 2–4. As previously indicated, FIG. 3 is a cross-sectional view of the layout geometry illustrated in FIG. 2. For convenience of illustration and to avoid unnecessary detail, an oxide coating on the surface of the device is not shown. FIGS. 2–4 shows a fragmentary part of a silicon chip 32 which, in turn, would be but one part of a silicon wafer containing many identical such chips that would all be formed simultaneously. Each chip 32 would contain a plurality of isolation pockets 34. Pockets 34 are formed by growing an N-type epitaxial layer on a P-type wafer and then diffusing a heavy concentration of a P-type impurity through the epitaxial layer in a grid-like pattern which is indicated by reference numeral 36. The original P-type wafer material is designated by reference numeral 38 in FIG. 3. It is often convenient to include a heavily doped N-type layer 40 beneath the isolation pockets 34 within the confines of the grid-line matrix 36. Layer 40 can be referred to as a buried layer. In junction isolated devices of the type illustrated in this drawing, this is desirable to not only preclude the formation of parasitic transistors with the isolation regions but also to lower collector contact series resistance.

In my invention, the P-type isolation grid does not merely surround the isolation pocket 34a. It includes an integral extension 36a that projects into isolation pocket 34a.

Isolation pocket 34a serves as the collector 12 for the resultant transistor formed in the isolation pocket 34a. A rectangular P-type diffusion region 16 serves as the base region for this transistor. It has an integral elongated portion 18 which provides an integral resistance in the base region. As can be seen, it extends around the isolation extension 36a so as to be disposed on one side 42 of the isolation wall extension 36a. An island-like N-type diffusion region 14 is disposed within the P-type diffusion region 16 to provide an emitter transistor region. An N+ collector enhancement region 12a is formed in a portion of the collector region 12 by the emitter diffusion 14 in the usual manner. Region 12a is directly over a previously formed N+ deep diffusion region 12b which provides a low resistance inter-connection between the buried layer 40 and the overlying N+ diffusion region 12a. Thus, there is a low resistance collector connection provided via the N-type regions 40, 12b and 12a to the top side of the isolation pocket 34a. Buried layer 40 is present beneath substantially all of the P-type diffusion regions indicated by reference numerals 16 and 18 in pocket 34a. Accordingly, it curves around isolation wall 36a when viewed from above and would thus be generally U-shaped in configuration if shown in the plan view of FIG. 2. However, it is not shown even in hidden line to avoid confusion with the principal attributes of this invention.

It can, therefore, be seen that connection to the collector region 12 of the transistor formed in isolation pocket 34a is made on a side 44 of isolation wall 36a opposite from the side 42 on which the end of the resistor 18 is disposed.

FIG. 4 shows the chip portion 32 of FIGS. 2 and 3 after a metal conductor pattern has been formed on it, and contact made to the various semi-conductor regions which were hereinbefore described. The hereinbefore described regions are shown in hidden lines in FIG. 4. A dielectric coating is not shown on the semi-conductor chip portion 32 above or below the metal conductor pattern nor are surface undulations normally associated with it. However, such dielectric layers would, of course, normally be used since it is necessary to insulate the metal conductor pattern from the chip surface except at intended points of contact with selected regions. Also, it is usually desirable to protect the metal conductor pattern with a covering layer of dielectric. FIG. 4 shows the metallization pattern without the dielectric layers to more easily compare the features of the metal conductor pattern and its underlying regions with the electrical schematic of FIG. 1. It includes a metallization runner 20 having an extension 20b which connects to the emitter region at 22 which is also designated E. Metal runner 20 also has a second extension, indicated by reference numeral 20a which makes connection to the free end of the base region resistor 18 at 46 which is also designated $B_2$. A separate metal runner 28 extends to a portion of the base region 16 adjacent to the emitter region 14 to make a low resistance electrical connection with the base region 16 at 30 which is also designated $B_1$. Electrical connection to the N-type material forming pocket 34a, i.e. the transistor collector, is made by a metal runner 24 which makes contact with the N+ diffusion region 12a at 26 which is also designated C. It should also be understood that electrical contact is made with the P-type diffusion region 36 and/or the underlying P-type wafer material 38. Such contacts are not ordinarily made within the field of view of this drawing. They are therefore not shown.

From FIG. 4, it is quite more apparent that, under normal operating conditions, there will be a reverse bias between the collector contact 26 and the base region resistor contact 46, and an attendant significant resistance therebetween will exist. However, in this invention, such a significant resistance will still exist even if this polarity is accidentally reversed, because C and $B_2$ are spaced by the isolation wall extension 36a. It should also be recognized that this invention will help, even if it is desired to include buried layer 40 under the resistor portion 18 in the right hand part of pocket 34a, as shown. There will still be a significant length of buried layer between C and $B_2$ through which current must travel, which still can provide transient protection. However, if transient protection is more important than suppressing parasitic transistor action, one may choose to use the buried layer only under the transistor portion of pocket 34a, i.e. to the left of isolation wall extension face 44 in FIGS. 2 and 3. It would thus not be present to the right of face 42 on isolation wall extension.

Figure 5:
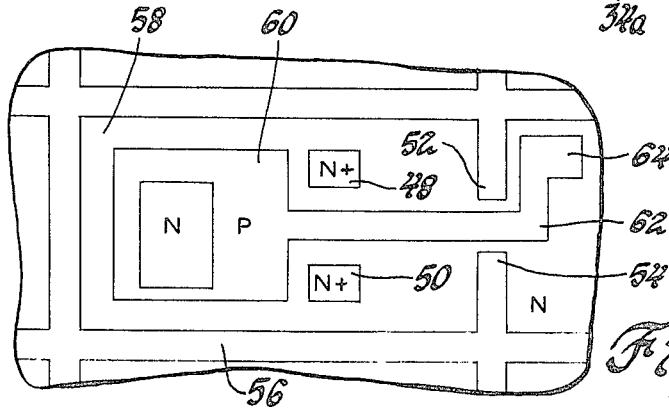
FIG. 5 shows another embodiment of the transistor-resistor combination illustrated in FIG. 2.

Another variation of this invention, with two collector contacts 48 and 50, is shown in FIG. 5. In such instance, it may be desirable to include two isolation wall extensions instead of one. They are designated by reference numerals 52 and 54 and project towards one another from opposite sides of the surrounding isolation wall 56. In this FIG. 5 embodiment of the invention, the base region of the transistor is formed by the larger rectangular P-type diffusion region 60. It has an integral extension 62 that projects through an opening between the two facing isolation wall extensions 52 and 54. The extension 62 forms an integral resistor. Functionally, it need not bend around either of isolation wall extensions 52 and 54 once it passes between them. However, if not, then it should extend an equivalent distance past them to provide a contact area 64 that is equivalently spaced from the collector contacts 48 and 50. Contact area 64 would correspond to contact $B_2$ in FIG. 1. In such instance, the length of the isolation pocket 58 must be expanded. To make it shorter, and the resultant integrated circuit more compact, I prefer to bend the resistor 62 around one of the isolation wall extensions, as shown in FIG. 5.

Incidentally, this invention has been described in connection with a junction isolated integrated circuit. It is equally applicable to integrated circuits isolated by other techniques as, for example, a dielectric isolation. The example of this invention that has been described is a vertical bipolar transistor. I believe that the principles of my invention can also be applicable to lateral transistors too. The lateral transistor can be conventionally formed. One need only form it in an N-type isolation pocket having an isolation wall extension, such as the isolation wall extension 36a shown in FIG. 2. By way of specific example, the lateral transistor would be formed by two spaced but adjacent P-type diffusion regions in an N-type isolation pocket on one side of the isolation wall extension. These two diffusions would respectively form the emitter and collector regions for a PNP transistor as usual. A first N+ region between these two spaced but adjacent regions forms the base region contact $B_1$ for the PNP transistor. A second N+ region on the opposite side of the isolation wall extension would provide a contact $B_2$ for an integral base region resistor. The diffusion regions can be aligned in a straight row in the N-type pocket. In such instance the P-type and N+ regions would alternate in the row but the isolation wall would space the two regions at one end. More specifically, this would provide an alignment in the pocket of an emitter region, a first base contact region, a collector region, an isolation wall, and then a second base contact region. The isolation wall would therefore be disposed between an integral contact $B_2$ for the base resistor and a collector contact C. This would provide analogous benefits to those described in connection with the NPN vertical transistors shown in the drawing.

The embodiments of the invention in which an exclusive property or privilege is claimed are defined as follows:

1. An integrated circuit having a plurality of isolation pockets and a bipolar transistor with integral base region reistor that includes compact protection against base-collector polarity reversal, comprising:

an integrated circuit chip having isolation walls defining a pocket of semi-conductive material;
an inward extension of said isolation walls that partially divides said pocket into parts;
emitter, base and collector regions of a bipolar transistor formed in one part of said pocket, said base region having an integral resistive portion that extends past said isolation wall extension into another part of said pocket;
a contract to said emitter region on said one pocket part;
a contact to said base region on said one pocket part;
a contact to said collector region on said one but not said other pocket part; and
a contact to said base region integral resistive portion on said another pocket part that is spaced from said collector region contact by said isolation all extension, effective to provide a protective resistance between the base region extension contact and the collector contact upon undesired polarity reversal therebetween.

2. An integrated circuit having a bipolar transistor with integral base region resistor comprising:

an integrated circuit chip having a plurality of PN junction isolation pockets of one conductivity-type silicon forming a collector region of a bipolar transistor, one of said pockets having first and second parts that are spaced by a PN junction isolation wall;
an opposite conductivity type first island-like region having portions disposed on both pocket parts;
a second island-like region of the one conductivity type disposed within the first island-like region portion in only one pocket part;
a first conductor in low resistance electrical contact with both the second island-like region and an area of the first island portion in the second pocket part;
a second conductor in low resistance electrical contact with an area of the first island portion in the first pocket part; and
a third conductor in low resistance electrical contact with the first, and not the second, pocket part on a side of said PN junction isolation wall spacing said pocket parts that is opposite from said first conductor contact area in the second pocket part, effective to provide a predetermined minimum resistance therebetween regardless as to the polarity of electrical potential therebetween.

3. An integrated circuit having a plurality of isolation pockets and a vertical bipolar transistor in one of them that has an integral base region resistor coacting with circuit isolation walls to provide compact integral transient protection, comprising:

an integrated circuit chip having a plurality of island portions serving as bipolar transistor collector regions and separated from other chip portions by bottom and side electrical isolation walls;
an inward extension of said side isolation wall partially transversely dividing one of said island portions into two parts;
a transistor base region disposed in one island part and having an integral extension thereof also disposed in the other island part, bypassing said isolation wall extension, to provide an integral base region resistor having a contact area in said other island part;
a transistor emitter region disposed in said base region;
an emitter contact on said emitter region;
a base contact to said base region in said one island part;
a collector contact only to said one island part, adjacent one side of said isolation wall extension;
an ohmic contact to said base region resistor contact area that is electrically in parallel with said emitter contact and disposed on an opposite side of said isolation wall extension, effective to induce a significant protective resistance between said collector and ohmic contacts upon transient polarity reversal up to a predetermined voltage.

4. An integrated circuit chip having a plurality of isolation pockets and in one of them a vertical bipolar transistor having an integral base region resistor coacting with circuit isolation walls to provide compact integral protection against an electrical transient, comprising:

an integrated circuit chip having a plurality of N-type island portions serving as bipolar transistor collector regions and separated from other chip portions by bottom and side P-type electrical isolation walls;
at least one electrical isolation wall intruding into at least one of said islands to separate it into two parts without transversely severing it;
a P-type transistor base region disposed in one island part and having an integral extension thereof that extends around the intruding isolation wall to provide a compact integral base reqion resistor with a contact area in the other island part;
a transistor emitter region disposed in said base region in said one island part;
a collector ohmic contact only to said one island part;
an ohmic contact to said base region resistor contact area in said other island part, said ohmic contact electrically in parallel with said emitter [contact]; and
the intruding isolation wall spacing said collector and resistor contacts, so as to provide a predetermined protective resistance between said contacts upon undesired transient polarity reversal therebetween.

\* \* \* \* \*

UNITED STATES PATENT AND TRADEMARK OFFICE
CERTIFICATE OF CORRECTION

PATENT NO. : 4,486,770
DATED : December 4, 1984
INVENTOR(S) : Gary K. Woodward

It is certified that error appears in the above—identified patent and that said Letters Patent is hereby corrected as shown below:

Column 5, line 16, "reistor" should read -- resistor --.

Column 5, line 27, "contract" should read -- contact --.

Column 5, line 35, "all" should read -- wall --.

Column 6, line 52, "reqion" should read -- region --.

Column 6, line 59, "[contact]" should be deleted.

*Signed and Sealed this*

*Second* Day of *July 1985*

[SEAL]

*Attest:*

DONALD J. QUIGG

*Attesting Officer*     *Acting Commissioner of Patents and Trademarks*